United States Patent
Greulich-Weber

(10) Patent No.: US 10,043,994 B2
(45) Date of Patent: Aug. 7, 2018

(54) LAYERED STRUCTURE OF A LUMINESCENT DEVICE, METHOD FOR PRODUCING AND OPERATING A LUMINESCENT DEVICE AND CORRESPONDINGLY PRODUCED LUMINESCENT DEVICE

(75) Inventor: Siegmund Greulich-Weber, Bad Lippspringe (DE)

(73) Assignee: Universitaet Paderborn, Paderborn (DE)

( * ) Notice: Subject to any disclaimer, the term of this patent is extended or adjusted under 35 U.S.C. 154(b) by 643 days.

(21) Appl. No.: 13/698,396

(22) PCT Filed: May 18, 2011

(86) PCT No.: PCT/DE2011/001110
§ 371 (c)(1),
(2), (4) Date: Jan. 10, 2013

(87) PCT Pub. No.: WO2012/006986
PCT Pub. Date: Jan. 19, 2012

(65) Prior Publication Data
US 2013/0119889 A1    May 16, 2013

(30) Foreign Application Priority Data
May 19, 2010  (DE) .................. 10 2010 021 322

(51) Int. Cl.
*H01L 51/50* (2006.01)
*B32B 5/02* (2006.01)
(Continued)

(52) U.S. Cl.
CPC .......... *H01L 51/5092* (2013.01); *B32B 5/026* (2013.01); *B32B 27/304* (2013.01);
(Continued)

(58) Field of Classification Search
None
See application file for complete search history.

(56) References Cited

U.S. PATENT DOCUMENTS

2005/0009227 A1    1/2005  Xiao et al.
2005/0179373 A1*   8/2005  Kobayashi ................ 313/506
(Continued)

FOREIGN PATENT DOCUMENTS

DE    10 2006 047 045    4/2008
EP    1 403 908          3/2004
(Continued)

OTHER PUBLICATIONS

International Search Report of PCT/DE2011/001110, dated Nov. 25, 2011.
(Continued)

*Primary Examiner* — Anthony J Frost
(74) *Attorney, Agent, or Firm* — Collard & Roe, P.C.

(57) ABSTRACT

The invention relates to a layered structure (1) of an apparatus that luminesces by means of organic luminescence, which consists of at least two layers (2, 3) of transparent, semiconductive fibers as a substrate and an electrode, as well as a layer (5) disposed between adjacent layers (2, 3), composed of a photoactive polymer, in which layer, in interaction with the adjacent layers (2, 3) of transparent, semiconductive fibers, an organic luminescence (7) can be brought about. Furthermore, methods for the production and for the operation of corresponding layered structures, and a luminescent apparatus formed from them, are indicated.

33 Claims, 2 Drawing Sheets

Figure 1:
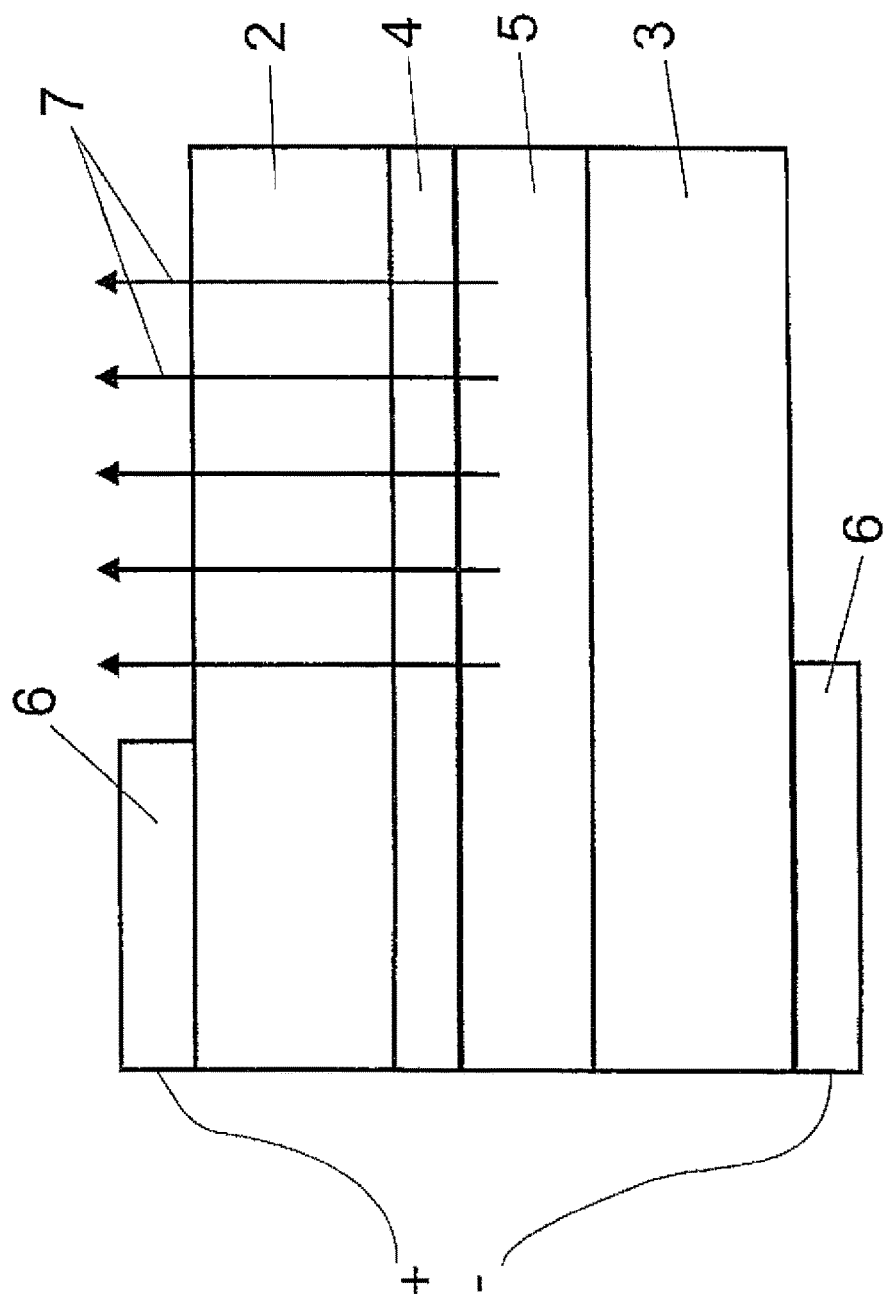

(51) Int. Cl.
  *B32B 27/30* (2006.01)
  *H01L 51/00* (2006.01)
  *H01L 51/52* (2006.01)
  *H01L 51/56* (2006.01)
  *H05B 33/10* (2006.01)
  *H05B 33/12* (2006.01)
  *H05B 37/02* (2006.01)

(52) U.S. Cl.
  CPC ...... *H01L 51/0001* (2013.01); *H01L 51/0024* (2013.01); *H01L 51/0097* (2013.01); *H01L 51/5036* (2013.01); *H01L 51/5203* (2013.01); *H01L 51/56* (2013.01); *H05B 33/10* (2013.01); *H05B 33/12* (2013.01); *H05B 37/02* (2013.01); *B32B 2262/10* (2013.01); *B32B 2457/202* (2013.01); *B32B 2607/02* (2013.01); *H01L 51/0036* (2013.01); *H01L 51/0038* (2013.01); *H01L 51/0039* (2013.01); *H01L 51/5016* (2013.01); *H01L 51/524* (2013.01); *H01L 2251/5323* (2013.01); *H01L 2251/5338* (2013.01); *H01L 2251/5361* (2013.01); *Y02E 10/549* (2013.01); *Y02P 70/521* (2015.11)

(56) References Cited

U.S. PATENT DOCUMENTS

| | | | |
|---|---|---|---|
| 2008/0238305 A1* | 10/2008 | Kondo et al. | 313/504 |
| 2008/0268282 A1* | 10/2008 | Spindler | C09K 11/06 428/690 |
| 2009/0117327 A1* | 5/2009 | Takada | 428/141 |
| 2009/0309094 A1* | 12/2009 | Frey | C09K 11/06 257/40 |
| 2010/0000599 A1* | 1/2010 | Greulich-Weber | H01L 51/424 136/255 |
| 2010/0195337 A1 | 8/2010 | Heite et al. | |

FOREIGN PATENT DOCUMENTS

| | | |
|---|---|---|
| WO | WO 02/10809 | 2/2002 |
| WO | WO 2009/030701 | 3/2009 |

OTHER PUBLICATIONS

Gerstmann, U. et al. "Surface Magnetism: Relativistic Effects at Semiconductor Interfaces and Solar Cells." W.E.Nagel et al. (eds.), High Performance Computing in Science and Engineering '12, pp. 129-143 (2013).

* cited by examiner

LAYERED STRUCTURE OF A LUMINESCENT DEVICE, METHOD FOR PRODUCING AND OPERATING A LUMINESCENT DEVICE AND CORRESPONDINGLY PRODUCED LUMINESCENT DEVICE

CROSS REFERENCE TO RELATED APPLICATIONS

This application is the National Stage of PCT/DE2011/001110 filed on May 18, 2011, which claims priority under 35 U.S.C. § 119 of German Application No. 10 2010 021 322.5 filed on May 19, 2010, the disclosure of which is incorporated by reference. The international application under PCT article 21(2) was not published in English.

The invention relates to a layered structure of a luminescent apparatus, to methods for the production and for the operation of a luminescent apparatus, as well as to a correspondingly produced luminescent apparatus.

Studies have shown that the natural light environment of humans is predominantly determined by diffuse brightness, even though the sun, as the primary light source, is perceived as a light point. The atmosphere ensures scattering of the sunlight and a perceived more homogeneous lighting of our surroundings, which our current light sources do not produce. In closed spaces, a uniform, full-area light emission from walls and ceiling, at a pleasant intensity that is not overly high, would be ideal. Formerly, this was attempted with so-called indirect lighting, whereby the light emission from the walls is then not optimal. Likewise, work is currently being done on an optimized light, with regard to coloring over the course of the day, in order to adapt this to our biorhythm. For this purpose, large-area light sources that can change in color tone are desirable. In addition, it is important to find an energy-saving and environmentally friendly successor to the incandescent bulb. The so-called energy-saving bulb is generally assessed as being only an impractical interim solution. Inorganic LEDs on the basis of gallium nitride (white light-emitting diode), for example, can fundamentally not be used as large-area lighting, particularly also not for flexible processing. Here, large-area refers to surface areas in the range of square meters.

The more recent organic LEDs (OLEDs) are predicted to have a large market if some fundamental problems are solved. These would have the advantages, right from the start, that they can be used on large areas, can be coordinated in terms of color, are extremely thin, work more efficiently, and are more advantageous in production. Since the invention of OLEDs about 20 years ago, the technology has been greatly further developed. However, some problems that are currently being worked on intensively worldwide must be solved before any market breakthrough can occur (many expect the market breakthrough to occur within the coming year). In the case of conventional LED structures with large areas, the problem of contacting distribution, which can be solved only with difficulty, arises. A network of electrical contacts must be drawn over the polymer in order to achieve uniform light distribution. Experience has shown that a coating with a transparent, conductive layer alone is not sufficient in the case of modules that are larger than 50×50 $mm^2$. Furthermore, the light-active layer must be applied to a substrate that otherwise has no function.

The major advantages of the OLEDs are the particularly low energy demand, limitless coloring, no heat development at all (therefore the high degree of effectiveness), low thickness, and many more. Aside from minor problems of optimized coloring and, depending on the design, the required protective layer to prevent penetration of oxygen, these are, above all, questions of "homogeneous" contacting and large-area substrates. Simple smaller OLED displays are already being used in consumer products (including warranties with regard to useful lifetime, for example). In most cases, glass is used as a substrate on both sides, which would make the lighting product or display become extremely heavy at sizes of more than a square meter. For the necessary contacting, a nanometer structure must be used in an ideal case, causing additional significant costs. A usable flexible and transparent solution for lighting products on an OLED basis has not become known up to the present.

It is therefore the task of the present invention to indicate a layer structure of the type stated, as well as methods for production and operation, and corresponding luminescent apparatuses in which area-type lighting can be produced and operated in simple manner.

The solution of the task according to the invention is evident, with regard to the layer structure, from the features described herein; with regard to the methods, from the features described herein; and, with regard to a luminescent apparatus, from the features described herein. Further advantageous embodiments of the invention are evident from the description.

The invention proceeds from a layered structure of an apparatus that luminesces by means of organic luminescence. Such a layered structure is developed further in that the layered structure consists of at least two layers of transparent, semiconductive fibers, as well as a layer disposed between adjacent layers, composed of a photoactive polymer, in which layer, in interaction with the adjacent layers of transparent, semiconductive fibers, an organic luminescence can be brought about. Corresponding layers of transparent, semiconductive fibers are fundamentally known from DE 10 2006 047 045 A1, the content of which is also made an object of the present invention here. In DE 10 2006 047 045 A1, it is described in detail how such layers can be produced, even though it is merely indicated there that the layers can serve for the production of a solar cell. If one uses such layers for the production of an apparatus that luminesces by means of organic luminescence, then an advantageous carrier structure for building up a substrate and an electrode can be created in this manner, which is transparent, for one thing, and is therefore suitable for passing light through. For another thing, by means of the use of such a layer, in the manner described in DE 10 2006 047 045 A1, contacting between the layers that serve as the electrode or substrate, respectively, and the photoactive polymer is created, which allows contacting over almost the entire surface area, between the layers and the photoactive polymer, for one thing, and, at the same time allows advantageous mechanical properties by means of the formation as a woven textile that is stable, on the one hand, but on the other hand is light and non-rigid. By means of these advantageous mechanical properties, handling of such a layered structure is particularly simple, while maintaining all the electrical and optical properties, and adaptation to purposes of use can take place in simple manner; in particular, such a layer is particularly light for purposes of use. The layers of transparent, semiconductive fibers bring about an organic luminescence in the layer of the photoactive polymer when an electrical voltage is applied, if the properties of the semiconductive fibers and of the layer of the photoactive polymer are coordinated with one another accordingly. In this way, it is guaranteed that a corresponding light can be emitted uniformly almost over the entire surface area of the layered structure when an electrical voltage is applied, which light exits to the outside in the form of a diffuse light exit from the layered structure, and the intensity and spectrum of which light can be influenced, within broad limits, by means of a corresponding influence on transparent, semiconductive fibers and photoactive polymer. In this connection, the layered structure is particularly simple, so that the production of a corresponding layered structure is also possible in simple and therefore cost-advantageous manner. An advantage of the layered structure according to the invention is that no separate substrate is required, but rather the fibers fulfill a multiple purpose: They are a main component of the semiconductor element for generating light, and at the same time, can serve as a substrate. In the state of the art, a separate substrate, under some circumstances even a textile substrate, is always required otherwise, but this never takes on an electrical function or component function. The doped, transparent, at least partly monocrystalline fibers form an electrically and optically active inorganic-organic hybrid structure, whereby the layered structure according to the invention forms a semiconductive component together with the fibers. Thus, building up the semiconductive component is significantly simplified, and therefore the component can be produced more efficiently.

It is particularly advantageous if, in a first embodiment, the layers of transparent, semiconductive fibers are formed from fibers made from silicon carbide SIC, zinc oxide ZnO, or titanium dioxide $TiO_2$ or similar transparent, semiconductive fibers. Such semiconductive materials can be produced in the most varied ways, whereby in particular, the production of fibers made from silicon carbide can take place according to the method according to DE 10 2006 047 045 A1, for example. For other semiconductive fibers, corresponding production methods can also be performed, which allow cost-advantageous production of the fibers, particularly also directly in the form of woven fabrics or laid scrims. In this way, the result can also be achieved, in particular, that the layers of transparent, semiconductive fibers have a textile-like structure of semiconductive fibers disposed adjacent to one another, preferably short fibers. Such a structure as a woven textile has the advantage that the processing of layers produced accordingly can take place similar to conventional textiles, and that the areas of use of layers produced accordingly can also go into the area of textile cases of use. Such a layered structure is particularly flexible mechanically, and can withstand stress.

Aside from the fundamental structure of the layers described above, it is also possible that additional layers, particularly electron-injection layers, perforated barrier layers, perforated transport layers, or perforated injection layers, can be included in the layered structure. In this way, properties of the layered structure can be controlled in targeted manner, and the occurrence of the organic luminescence can be influenced and improved.

With regard to the layered structure, it is furthermore advantageous if one of the layers of transparent, semiconductive fibers is coated with the photoactive polymer on one side, or, in a different embodiment, is also encased on all sides. In this way, particularly great contacting between the layer of the transparent, semiconductive fiber material and the photoactive polymer can be produced; at the same time, in the case of encasing on all sides, the proportion of surface area that is available in the photoactive polymer for the organic luminescence is particularly great. In the case of encasing on all sides, the result can furthermore be achieved that at least one of the layers of transparent, semiconductive fibers is encased with the photoactive polymer on all sides, in such a manner that a luminescent effect occurs in the photoactive polymer, which effect takes place essentially on the entire circumference of the semiconductive fibers of the one layer, in contact with the other layer of transparent, semiconductive fibers. In this way, the entire photoactive polymer layer contributes to the organic luminescence, independent of whether or not the region of the photoactive polymer layer borders on the counter-electrode directly.

It is of significant influence that the thickness of the layer composed of the photoactive polymer lies in the range of less than 100 nm, preferably in the range of a few 10 nm. In this way, the result is achieved that the organic luminescence takes place in the photoactive polymer in targeted manner, and that radiation-free recombination paths of the electrical charges are precluded, to a great extent. As a result, the utilization of the recombination with the photoactive polymer is particularly great, as is the effectiveness of the layered structure.

It is essential for the influence of the quality of the formation of the organic luminescence that the fibers of the layers of transparent, semiconductive layers can be doped, preferably as a function of the composition of the photoactive polymer, particularly also in order to influence the color of the light emissions brought about in the photoactive polymer. By means of corresponding doping of the layers of transparent, semiconductive fibers, and in this connection, practically all known dopings can be used for these semiconductive fibers, and in a further embodiment of coordination of the composition of the photoactive polymer, the result can be achieved that the desired color of the light emissions of the layered structure is actually produced and emitted within the layer of the photoactive polymer. Corresponding dopings of the layers of transparent, semiconductive fibers, and also coordination with the properties of the photoactive polymers, permit a great number of variants of the organic luminescence, which can be utilized for practical use of the layered structure as a luminescent element. In this connection, a plurality of doping possibilities and photoactive polymers known to a person skilled in the art can be used. For example, photoactive polymers that can be used are CV-PPV, PPP, P3HT (poly-(3-hexylthiophene)), MDMO-PPV (poly-(2-methoxy-5-(3',7'-dimethyloctyloxy)-1,4-phenylene-vinylene)), MEH-PPV (poly-(2,5-dialkoxy-para-phenylene-vinylene)), and PFB (poly-(9,9'-dioctylfluorene-co-bis-N,N'-(4-butylphenyl)-bis-N,N'-phenyl-1,4-phenylene-diamine)), or similar photopolymers. In a further embodiment, however, it is also possible that a mixture of different photoactive polymers is used as a photoactive polymer material; one then speaks of so-called blends of such photoactive polymers. In this connection, mixing of such photoactive polymers allows precise coordination to a desired light color of the light emitted by the layered structure on the basis of the organic luminescence, particularly also with inclusion of coordination of the corresponding doping of the layers of transparent, semiconductive fibers. Thus, for example, it is possible that light having essentially a white spectrum is emitted as the luminescent color, by means of suitable mixing of the materials of the photoactive polymer. Of course, coordination with other colors within the achievable spectrum is also possible.

In another embodiment, however, it is also possible that a luminescence pigment, particularly a substance that contains phosphorus, is disposed in or on the layer of the photoactive polymer, or on the path of the light exit from the layered structure, as a fluorescent substance, which substance is excited by the light emitted by the photoactive polymer, which is preferably blue, to luminesce in the spectral range of white light. Such a conversion of a light color to a white light color, by means of a substance that contains phosphorus, is fundamentally known in the sector of LED technology, and can also be applied here.

For contacting between the different layers of the layered structure, it is advantageous if the layers of transparent, semiconductive fibers are coated with a conductive polymer material on one side, or also encased on all sides. Such a conductive polymer material can have a transparent organic or inorganic material, for example, and is also fundamentally known from the state of the art.

For contacting of the two layers of transparent semiconductive fibers with an electrical voltage to be applied from the outside, it is advantageous if the layers of transparent, semiconductive fibers are coated in sections, preferably at their edges, with electrically conductive layers, preferably composed of metallic materials, by way of which an electrical current can be coupled into the layered structure. By means of this method of preferably edge-side contacting, an advantageous transition of the applied voltage from the feed line to the electrically conductive layers and then to the layers of transparent semiconductive fibers can be achieved, for one thing; for another, an edge-side coating is particularly advantageous with regard to the spatial feed by means of cables or the like.

Furthermore, it is practical that the layered structure is encased with a transparent cover material, essentially encapsulated completely. Such an encapsulation by means of the transparent cover material is supposed to prevent chemical and physical interactions of the layered structure with the surroundings, which are known to be disadvantageous for the useful lifetime, from the sector of OLED technology. In this connection, it is also advantageous if a correspondingly thin coating, for example composed of a polymer material or the like, is applied to the layered structure, to cover it, for the purpose of encapsulation.

The invention furthermore relates to a method for the production of a layered structure of a luminescent apparatus, in which a first layer of transparent, semiconductive fibers is coated or encased with a conductive polymer material, the second layer of transparent, semiconductive fibers is coated or encased with a photoactive polymer, onto which a conductive polymer material is applied, and the layers of the conductive polymer material of the first and the second layer of transparent, semiconductive fibers are glued to one another. Such a layered structure can be implemented in particularly simple manner, by means of the possibility of serial processing of the individual layers of semiconductive fibers, independent of whether it involves one-side coating or all-sided encasing. Thus, not only the coating with the conductive polymer material but also with the photoactive polymer can be undertaken in simple manner, and their quality can be assured. Likewise, it is possible that a connection of the individual layers of the layered structure takes place, according to the method, in that the materials of the conductive polymer and/or of the photoactive polymer are processed in liquid form and produce a corresponding gluing or adhesion to the other layers as they harden. In this way, additional adhesives or similar materials can be avoided.

Furthermore, it is possible that a preferably metallic coating is applied for contacting, preferably at the edge side and/or in certain sections, to the two layers of transparent, semiconductive fibers. Such a coating can be applied electrochemically or thermally or in similar manner, for example, to the layer of transparent, semiconductive fibers, and thus can guarantee great adhesion and a good transition of applied electrical voltage.

The invention furthermore relates to a method for operation of a luminescent apparatus, in which the layers of transparent, semiconductive fibers have an electrical voltage, preferably a changeable one, applied to them, by means of which the photoactive material is excited to luminesce as the result of recombination of charge carriers from the layers of transparent, semiconductive fibers. Applying an electrical voltage to the two layers of transparent, semiconductive fibers, as well as the interaction of the two layers of transparent, semiconductive layers with the photoactive polymer, ensures corresponding recombination processes in the photoactive polymer, which processes are fundamentally known from the sector of organic luminescence. The light emission that can be achieved in this way, on the basis of the method for operation of a luminescent apparatus, represents a diffuse light emission of very uniform intensity, which is particularly suitable for area-type lighting. Both the light intensity and the emitted light color, if applicable, can be changed, in this connection, and easily adapted to the needs of a user, in each instance.

It is furthermore possible that multiple layered structures are disposed, one on top of the other, in such a manner that each layered structure emits light having a fixed spectral composition, the sum effect of which yields light emitting the desired mixed color, for an external observer. Thus, for example, light colors such as white, for example, can be emitted in combined manner, from the basic colors of the emissions of one of the multiple layered structures, in each instance, whereby each of the individual layered structures emits precisely one of the basic colors, and these are then added together to produce the desired light color, such as white, for example, for the observer. A mixed color that can be controlled with regard to its spectral composition and its partial intensities can be produced by means of controlling the intensity of the light emission of each individual layer of the photoactive polymer, so that a plurality of light colors and light intensities can be produced with such a layered structure.

In another embodiment, particularly when using mixtures of photoactive polymers, it is possible that the luminescent effect of a mixture of layers of the photoactive material that are configured differently is influenced, by means of electronic coordination with one of the photoactive materials, in each instance, in such a manner that only one or only specific photoactive materials respond, and that the luminescent color can be changed in this way. In this connection, electronic coordination ensures that only one or a few of the photoactive materials are excited, in each instance, to produce the organic luminescence, and that therefore only these materials bring about a corresponding light emission. Thus, a plurality of light colors can be produced by means of only one layer of photoactive polymer composed of a mixture of different photoactive materials.

Particularly with regard to controlling the intensity of the emitted light, it is advantageous if the intensity control of the light emitted by the layers of photoactive polymer takes place by means of controlling the voltage of the electrical voltages at the individual layers of the layered structure. In this way, simple influencing of the brightness of the overall emissions but also of the emissions of individual layers of the photoactive material can be achieved.

The invention furthermore relates to a luminescent apparatus for the production of large-area light sources. Such large-area light sources, in other words also in the range of square meters, can be configured, for example, as a wall covering, as a part of clothing, for example for better visibility of the wearer of the clothing, or also as a coating of window surfaces, which perform a lighting function also for interior spaces, in the dark. Beyond that, a plurality of cases of use of such luminescent apparatuses is possible, which shall not be addressed in detail here, but are evident from the properties and the large-area nature of the luminescent apparatus.

A particularly preferred embodiment of the layered structure according to the invention is shown in the drawing.

Figure 2:
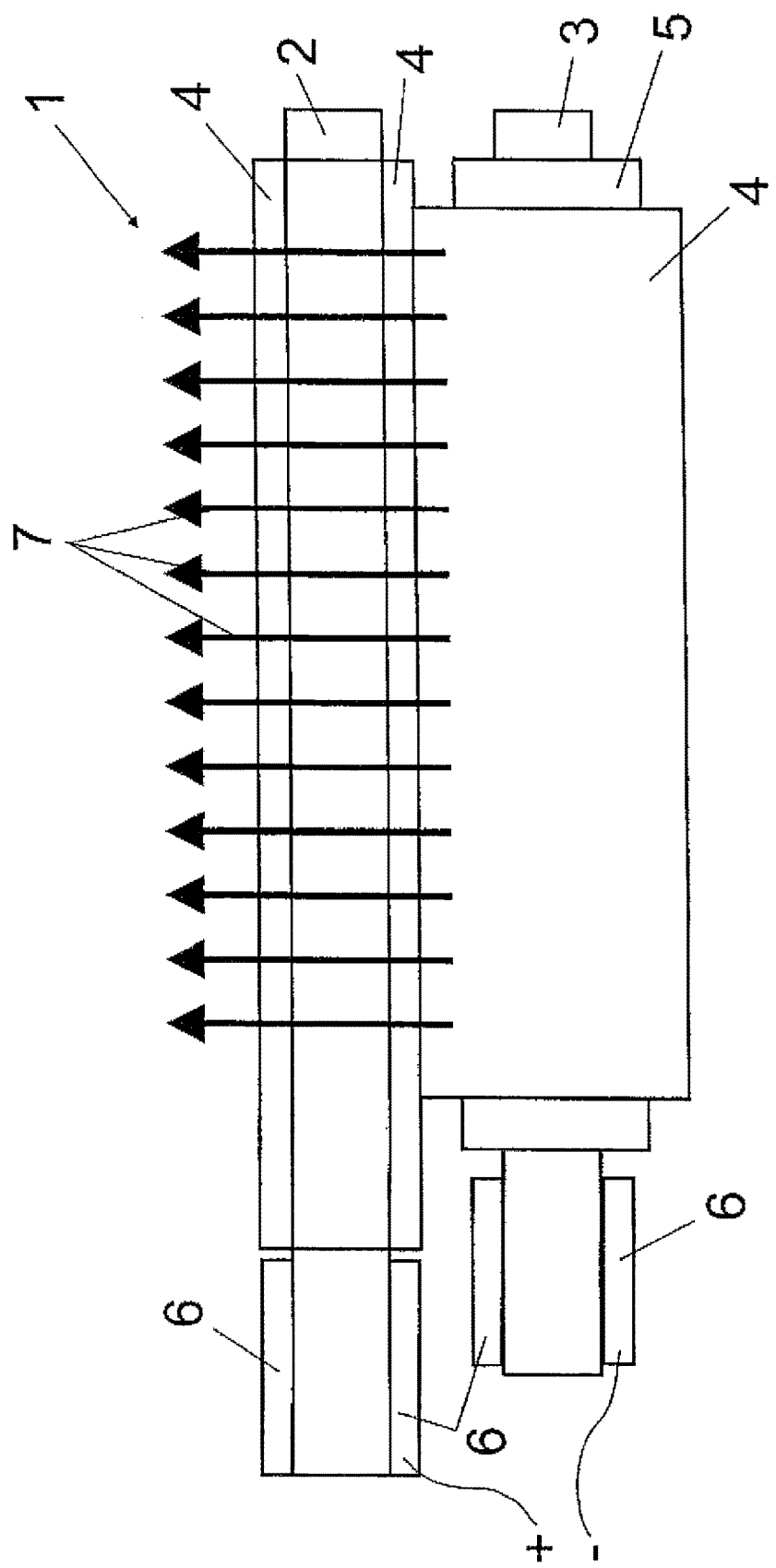

This shows:

FIG. 1—a schematic representation of a preferred layered structure according to the invention, in cross-section, with a planar coating of the two layers of transparent, semiconductive fibers and a layer composed of photoactive polymer, FIG. 2—another representation of another preferred layered structure, in cross-section, with an encasing coating of the two layers of transparent, semiconductive fibers and a layer composed of photoactive polymer.

In FIG. 1, a schematic representation of a preferred layered structure 1 according to the invention is shown, in cross-section, with a planar coating of the two layers 2, 3 of transparent, semiconductive fibers and a layer 5 composed of photoactive polymer, whereby a layer 4 composed of a conductive polymer is disposed between the layers 2 and 3. This layered structure 1 serves for the production of organic luminescent materials having a mechanical textile character, because the layers 2, 3 are formed from transparent, semiconductive fibers, like a textile material, and demonstrate corresponding properties such as light weight and lack of bending rigidity, as well as mechanical strength. In this connection, the layers 2, 3 serve as an electrode or substrate, respectively, in the formation of an organic, luminescent cell, in which known recombination processes take place when an external electrical voltage is applied to the electrical contact surfaces 6, which surfaces can be applied to the layers 2, 3 in the edge region. The flow of current leads to the induction of charges in the photoactive layer composed of polymer 5, whereupon this layer 5 gives off diffuse light radiation 7 to the surroundings, due to the photoactive properties of the layer 5. The spectral behavior of this radiation 7 depends on the configuration of the layers 2, 3 and, in particularly, on their doping, as well as on the composition and the properties of the layer 5 composed of the photoactive polymer, so that a great variance of the emitted radiation can be achieved, by means of corresponding compositions, in accordance with the layered structures that are constructed.

In this connection, the layers 2, 3 are coated with the layer 4 composed of a conductive polymer, as well as with the layer 5 composed of photoactive polymer on only one side, whereby the formation of the layered structure can be achieved, for example, by laying the layers 2, 3 onto one or both layers 4, 5 while these are still liquid, and then allowing these to harden. In this way, simple production of the layered structure according to the invention is guaranteed.

In FIG. 2, a representation of another preferred layered structure can be seen, in cross-section, with an encasing coating of the two layers 2, 3 of transparent, semiconductive fibers and an encasing, applied layer 5 composed of photoactive polymer, in which representation the layer 3 is covered, on both sides or all sides, by the layer 5 composed of photoactive polymer, and the latter, in turn, is covered, on both sides or all sides, by a layer 4 composed of a conductive polymer. This layer 4, composed of a conductive polymer, which encloses the layer 3, then in turn borders on a layer 4 composed of a conductive polymer, which covers the layer 2 of transparent, semiconductive fibers on both sides or all sides, again with full-area contact.

In this connection, as well, inducement of charges in the photoactive layer composed of polymer 5 can be produced by means of applying an external electrical voltage to the electrical contact surfaces 6, and the current flow that results from this, whereupon these charges generate diffuse light radiation 7 to the surroundings as the result of the photoactive properties of the layer 5, by means of recombination processes in the layer 5.

Not shown is an encapsulation that encloses the entire layered structure, by means of which physical or chemical influences of the surroundings on the layered structure are supposed to be minimized.

Luminescent apparatuses that can be produced from such layered structures can serve for the production of large-area light sources that give off diffuse light. Such large-area light sources, in other words also in the range of a size of square meters, can be used, for example, as a wall covering, as a part of clothing, for example for better visibility of the wearer of the clothing, or also as a coating of window surfaces, which perform a lighting function also for the interior spaces, in the dark. Beyond that, a plurality of cases of use of such luminescent apparatuses is possible, which shall not be addressed in detail here, but are evident from the properties and the large-area nature of the luminescent apparatus.

REFERENCE NUMBER LIST

1—layered structure
2—transparent electrode
3—transparent substrate
4—conductive polymer
5—photoactive polymer
6—electrical contact surface
7—light emission

The invention claimed is:

1. A layered structure of an apparatus that luminesces via organic luminescence, wherein the layered structure comprises:
   at least first and second layers of transparent, semiconductive fibers, as well as
   a third layer disposed between the first and second layers and comprising a photoactive polymer,
   wherein the organic luminescence can be produced via interaction of the third layer with the first and second layers,
   wherein the transparent, semiconductive fibers of at least one of the first layer and the second layer directly contact the photoactive polymer of the third layer, and
   wherein the first and the second layers of the transparent, semiconductive fibers perform a hybrid function of:
      helping generate the organic luminescence by conducting electricity and interacting with the photoactive polymer, and
      alone serving as a mechanically stable substrate for the apparatus.

2. The layered structure according to claim 1, wherein the first and second layers of transparent, semiconductive fibers are formed from fibers made from silicon carbide SiC, zinc oxide ZnO, or titanium dioxide $TiO_2$ or similar transparent, semiconductive fibers.

3. The layered structure according to claim 1, wherein the first and second layers of transparent, semiconductive fibers have a textile-like structure of semiconductive fibers disposed adjacent to one another, preferably short fibers.

4. The layered structure according to claim 3, wherein the layered structure is configured to be mechanically flexible, particularly flexible like a woven textile.

5. The layered structure according to claim 1, wherein additional layers, particularly electron-injection layers, perforated barrier layers, perforated transport layers, or perforated injection layers, can be included in the layered structure.

6. The layered structure according to claim 1, wherein one of the first and second layers of transparent, semiconductive fibers is coated on one side or encased on all sides with the third layer.

7. The layered structure according to claim 6, wherein the thickness of the third layer lies in the range of a few 100 nm, preferably in the range of a few 10 nm.

8. The layered structure according to claim 1, wherein the first and second layers of transparent, semiconductive fibers is encased with the photoactive polymer on all sides, in such a manner that a luminescent effect occurs in the photoactive polymer, which effect takes place essentially on the entire circumference of the semiconductive fibers of the first layer, in contact with the second layer of transparent, semiconductive fibers.

9. The layered structure according to claim 1, wherein the fibers of the first and second layers of transparent, semiconductive fibers can be doped, preferably as a function of the composition of the photoactive polymer, in order to influence the color of the light emissions brought about in the photoactive polymer.

10. The layered structure according to claim 1, wherein the composition of the photoactive polymer is selected in accordance with the desired color of the light emissions of the layered structure.

11. The layered structure according to claim 10, wherein the photoactive polymer is selected from the group consisting of CV-PPV, PPP, P3HT (poly-(3-hexylthiophene)), MDMO-PPV (poly-(2-methoxy-5-(3',7'-dimethyloctyloxy)-1,4-phenylene-vinylene)), MEH-PPV (poly-(2,5-dialkoxy-para-phenylene-vinylene)), and PFB (poly-(9,9'-dioctylfluorene-co-bis-N,N'-(4-butylphenyl)-bis-N,N'-phenyl-1,4-phenylene-diamine)), and similar photopolymers.

12. The layered structure according to claim 10, wherein a mixture of different photoactive polymers can be used as a photoactive polymer material.

13. The layered structure according to claim 12, wherein light having essentially a white spectrum can be adjusted as the luminescent color via suitable mixing of the materials of the photoactive polymer.

14. The layered structure according to claim 10, wherein a luminescence pigment, particularly a substance that contains phosphorus, is disposed in or on the third layer of the photoactive polymer, as a fluorescent substance, which substance is excited by the light emitted by the photoactive polymer, which is preferably blue, to luminesce in the spectral range of white light.

15. The layered structure according to claim 1, wherein the second layer of transparent, semiconductive fibers is coated on one side or encased on all sides with a conductive polymer material.

16. The layered structure according to claim 15, wherein the conductive polymer material has a transparent organic or inorganic material.

17. The layered structure according to claim 1, wherein the first and second layers of transparent, semiconductive fibers are coated in sections, preferably at their edges, with electrically conductive layers, preferably composed of metallic materials, by way of which an electrical current can be coupled into the layered structure.

18. The layered structure according to claim 1, wherein the layered structure is encased with a transparent cover material, essentially encapsulated completely.

19. The layered structure according to claim 18, wherein the transparent cover material prevents chemical and physical interactions of the layered structure with the surroundings.

20. A method for the production of a luminescent apparatus comprising a layered structure according to claim 1, the method comprising steps of:
coating or encasing a first layer of transparent, semiconductive fibers with a conductive polymer material,
coating or encasing the second layer of transparent, semiconductive fibers with a photoactive polymer,
applying a further conductive polymer material onto the photoactive polymer, and
gluing the layers of the conductive polymer material of the first and the second layer of transparent, semiconductive fibers to one another, and
wherein the first and the second layers of the transparent, semiconductive fibers are configured to perform a hybrid function of:
helping generate the organic luminescence by conducting electricity and interacting with the photoactive polymer, and
alone serving as a mechanically stable substrate for the luminescent apparatus.

21. The method according to claim 20, wherein the layers of transparent, semiconductive fibers are glued to one another in that one or both conductive polymer materials are applied in liquid form, and the layers of conductive polymer material are brought into full-area contact with one another.

22. The method according to claim 20, wherein a preferably metallic coating is applied for contacting, preferably at the edge side and/or in certain sections, to the two layers of transparent, semiconductive fibers.

23. A method for the operation of a luminescent apparatus comprising a layered structure according to claim 1, the method comprising a step of:
applying an electrical voltage, preferably a changeable one, to the layers of transparent, semiconductive fibers such that the photoactive material is excited to luminesce as the result of recombination of charge carriers from the layers of transparent, semiconductive fibers,
wherein the first and the second layers of the transparent, semiconductive fibers perform a hybrid function of:
helping generate the organic luminescence by conducting electricity and interacting with the photoactive polymer, and
alone serving as a mechanically stable substrate for the luminescent apparatus.

24. The method according to claim 23, wherein multiple layered structures according to claim 1 are disposed, one on top of the other, in such a manner that each layered structure emits light having a fixed spectral composition, the sum effect of which yields light emitting the desired mixed color.

25. The method according to claim 24, wherein the light given off by the multiple layers of photoactive polymer yields a mixed color that can be controlled with regard to its spectral composition and intensity, via controlling the intensity of the light emission of each individual layer of photoactive polymer.

26. The method according to claim 23, wherein the luminescent effect of the layer of the photoactive material formed by a mixture of layers that are configured differently is coordinated, via electronic coordination with one of the photoactive materials, in each instance, in such a manner that only one or only specific photoactive materials respond, and the luminescent color can be changed in this way.

27. The method according to claim 26, wherein the intensity control of the light given off by the layers of photoactive polymer takes place via voltage control of the electrical voltages at the individual layers of the layered structure.

28. The method according to claim 23, wherein radiation of the emitted light takes place in diffuse manner, preferably oriented in a main direction.

29. A luminescent apparatus, particularly a luminescent apparatus according to claim 1, for the production of large-area light sources.

30. A luminescent apparatus according to claim 29, wherein the luminescent apparatus is configured as a wall covering.

31. A luminescent apparatus according to claim 29, wherein the luminescent apparatus is configured as part of clothing.

32. A luminescent apparatus according to claim 29, wherein the luminescent apparatus is configured as a coating of window surfaces.

33. A layered structure that luminesces via organic luminescence, wherein the layered structure consists of:
- at least first and second layers of transparent, semiconductive fibers, as well as
- a third layer disposed between the first and second layers and comprising a photoactive polymer,
- wherein the organic luminescence can be produced via interaction of the third layer with the first and second layers,
- wherein the transparent, semiconductive fibers of at least one of the first layer and the second layer directly contact the photoactive polymer of the third layer, and
- wherein the first and the second layers of the transparent, semiconductive fibers perform a hybrid function of:
  - helping generate the organic luminescence by conducting electricity and interacting with the photoactive polymer, and
  - alone serving as a mechanically stable substrate.

* * * * *